United States Patent
Kim

(10) Patent No.: US 9,588,883 B2
(45) Date of Patent: Mar. 7, 2017

(54) FLASH MEMORY SYSTEM

(75) Inventor: Jin-Ki Kim, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 955 days.

(21) Appl. No.: 13/455,780

(22) Filed: Apr. 25, 2012

(65) Prior Publication Data

US 2013/0080730 A1  Mar. 28, 2013

Related U.S. Application Data

(60) Provisional application No. 61/538,540, filed on Sep. 23, 2011.

(51) Int. Cl.
*G06F 12/02* (2006.01)

(52) U.S. Cl.
CPC .. *G06F 12/0246* (2013.01); *G06F 2212/7201* (2013.01)

(58) Field of Classification Search
CPC ... G06F 12/0246; G06F 12/10; G06F 12/1009
USPC ........................................................ 711/103
See application file for complete search history.

(56) References Cited

U.S. PATENT DOCUMENTS

| | | | |
|---|---|---|---|
| 5,109,361 A | 4/1992 | Yim et al. | |
| 5,299,162 A | 3/1994 | Kim et al. | |
| 5,396,459 A | 3/1995 | Arakawa | |
| 5,473,563 A | 12/1995 | Suh et al. | |
| 5,541,879 A | 7/1996 | Suh et al. | |
| 5,546,341 A | 8/1996 | Suh et al. | |
| 5,671,178 A | 9/1997 | Park et al. | |
| 5,732,018 A | 3/1998 | Choi et al. | |
| 5,835,935 A | 11/1998 | Estakhri et al. | |
| 5,912,844 A | 6/1999 | Chen et al. | |
| 5,937,425 A | 8/1999 | Ban | |

(Continued)

FOREIGN PATENT DOCUMENTS

| CA | 2675565 | 8/2008 |
|---|---|---|
| CN | 1199909 | 11/1998 |

(Continued)

OTHER PUBLICATIONS

Tran, Michael Thanh, "U.S. Appl. No. 11/762,330 Notice of Allowance", May 12, 2009, pp. 1-4.

(Continued)

*Primary Examiner* — Prasith Thammavong
(74) *Attorney, Agent, or Firm* — Borden Ladner Gervais LLP

(57) ABSTRACT

A method and system for controlling an MBC configured flash memory device to store data in an SBC storage mode, or a partial MBC storage mode. In a full MBC storage mode, pages of data are programmed sequentially from a first page to an Nth page for each physical row of memory cells. Up to N virtual page addresses per row of memory cells accompany each page to be programmed for designating the virtual position of the page in the row. For SBC or partial MBC data storage, a flash memory controller issues program command(s) to the MBC memory device using less than the maximum N virtual page addresses for each row. The MBC memory device sequentially executes programming operations up to the last received virtual page address for the row.

29 Claims, 15 Drawing Sheets

(56) References Cited

U.S. PATENT DOCUMENTS

| | | |
|---|---|---|
| 5,953,255 A | 9/1999 | Lee |
| 5,995,417 A | 11/1999 | Chen et al. |
| 6,111,787 A | 8/2000 | Akaogi et al. |
| 6,118,705 A | 9/2000 | Gupta et al. |
| 6,128,224 A | 10/2000 | Morton et al. |
| 6,154,391 A | 11/2000 | Takeuchi et al. |
| 6,181,603 B1 | 1/2001 | Jyouno et al. |
| 6,208,556 B1 | 3/2001 | Akaogi et al. |
| 6,256,254 B1 | 7/2001 | Kwak et al. |
| 6,278,636 B1 | 8/2001 | Lee |
| 6,359,810 B1 | 3/2002 | Gupta et al. |
| 6,442,644 B1 | 8/2002 | Gustavson et al. |
| 6,456,528 B1 | 9/2002 | Chen |
| 6,522,580 B2 | 2/2003 | Chen et al. |
| 6,552,580 B2 | 4/2003 | Nilson et al. |
| 6,594,183 B1 | 7/2003 | Lofgren et al. |
| 6,671,204 B2 | 12/2003 | Im |
| 6,714,457 B1 | 3/2004 | Hsu et al. |
| 6,717,857 B2 | 4/2004 | Byeon et al. |
| 6,732,221 B2 | 5/2004 | Ban |
| 6,763,424 B2 | 7/2004 | Conley |
| 6,804,148 B2 | 10/2004 | Bedarida et al. |
| 6,807,103 B2 | 10/2004 | Cavaleri et al. |
| 6,870,773 B2 | 3/2005 | Noguchi et al. |
| 6,885,583 B2 | 4/2005 | Tanaka |
| 6,947,331 B1 | 9/2005 | Mirgorodski et al. |
| 6,958,938 B2 | 10/2005 | Noguchi et al. |
| 6,963,509 B1 | 11/2005 | Ju |
| 7,016,229 B2 | 3/2006 | Kim |
| 7,042,770 B2 | 5/2006 | Lee et al. |
| 7,046,554 B2 | 5/2006 | Lee |
| 7,061,813 B2 | 6/2006 | Lee |
| 7,082,056 B2 | 7/2006 | Chen et al. |
| 7,099,213 B2 | 8/2006 | Ju |
| 7,148,742 B2 | 12/2006 | Pan et al. |
| 7,149,130 B2 | 12/2006 | Lee |
| 7,308,524 B2 | 12/2007 | Grundy et al. |
| 7,332,946 B2 | 2/2008 | Pan et al. |
| 7,355,887 B2 | 4/2008 | Nakamura et al. |
| 2002/0067639 A1 | 6/2002 | Byeon et al. |
| 2002/0099904 A1* | 7/2002 | Conley ............... G06F 12/0246 711/103 |
| 2003/0099134 A1* | 5/2003 | Lasser et al. ............ 365/185.29 |
| 2003/0235080 A1 | 12/2003 | Yaegashi et al. |
| 2004/0080979 A1 | 4/2004 | Park |
| 2004/0105310 A1 | 6/2004 | Arai et al. |
| 2004/0148482 A1 | 7/2004 | Grundy et al. |
| 2004/0179403 A1 | 9/2004 | Noguchi et al. |
| 2004/0264252 A1 | 12/2004 | Morikawa et al. |
| 2005/0052908 A1 | 3/2005 | Tomoeda et al. |
| 2005/0157558 A1 | 7/2005 | Noguchi et al. |
| 2005/0232008 A1 | 10/2005 | Shukuri et al. |
| 2005/0276120 A1 | 12/2005 | Hsia et al. |
| 2006/0007616 A1 | 1/2006 | Pan et al. |
| 2006/0034128 A1 | 2/2006 | Han et al. |
| 2006/0133155 A1 | 6/2006 | Fujita et al. |
| 2007/0025151 A1* | 2/2007 | Lee .................... G11C 11/5621 365/185.11 |
| 2007/0057716 A1 | 3/2007 | Pan et al. |
| 2007/0076479 A1 | 4/2007 | Kim et al. |
| 2007/0076502 A1 | 4/2007 | Pyeon et al. |
| 2007/0109833 A1 | 5/2007 | Pyeon et al. |
| 2007/0268745 A1* | 11/2007 | Lasser ...................... 365/185.01 |
| 2008/0062762 A1 | 3/2008 | Doyle |
| 2008/0077728 A1* | 3/2008 | Kim .................... G06F 12/0246 711/103 |
| 2008/0123412 A1* | 5/2008 | Lasser ...................... 365/185.03 |
| 2008/0198651 A1* | 8/2008 | Kim ........................ 365/185.03 |
| 2009/0019321 A1* | 1/2009 | Radke .................... G11C 11/56 714/54 |
| 2009/0310406 A1 | 12/2009 | Sarin et al. |
| 2010/0020601 A1* | 1/2010 | Lee .................... G11C 11/5628 365/185.03 |

FOREIGN PATENT DOCUMENTS

| | | |
|---|---|---|
| JP | 06244386 | 9/1994 |
| JP | 07161852 | 6/1995 |
| JP | 09139095 | 5/1997 |
| JP | 09180472 | 7/1997 |
| JP | 10106279 | 4/1998 |
| JP | 11045986 | 2/1999 |
| JP | 11096777 | 4/1999 |
| JP | 2005116102 | 4/2005 |
| JP | 2006172630 | 6/2006 |
| JP | 2007026523 | 2/2007 |
| KR | 1020070057716 | 6/2007 |
| WO | 2007036047 A1 | 4/2007 |
| WO | 2007036048 A1 | 4/2007 |

OTHER PUBLICATIONS

Shirota, R. et al, "A 2.3 UM2 Memory Cell Structure for 16MB NAND EEPROMS", International Electron Devices Meeting 1990, Technical Digest; Dec. 1990, pp. 103-106.

Samsung Electronics Co. Ltd., "256 M x 8 Bit/ 128M x 16 Bit/512M x 8 Bit NAND Flash Memory", K9K4G08U1M, K9F2G08U0M, K9F2G16U0M, Revision 1.0, May 6, 2005, pp. 1-41.

Takeuchi, K. et al, "A Multipage Cell Architecture for High-Speed Programming Multilevel NAND Flash Memories", IEEE Journal of Solid-State Circuits, vol. 33, Issue 8, Aug. 1998, pp. 1228-1238.

Suh, K. et al, "A 3.3 V 32 MB NAND Flash Memory With Incremental Step Pulse Programming Scheme", IEEE Journal of Solid-State Circuits, vol. 30, No. 11, Nov. 1995, pp. 1149-1156.

Imamiya, K et al, "A 125-MM2 1-GB NAND Flash Memory With 10-Mbyte/s Program Speed", IEEE Journal of Solid-State Circuits, vol. 37, No. 11, Nov. 2002, pp. 1493-1501.

Cho, T. et al, "A Dual-Mode NAND Flash Memory: 1GB Multilevel and High Performance 512-MB Single-Level Modes", IEEE Journal of Solid-State Circuits, vol. 36, No. 11, Nov. 2001, pp. 1700-1706.

"Samsung Announces First 40 Nanometer Device-32GB NAND Flash With Revolutionary Charge Trap Technology", World Press Release, Sep. 11, 2006, pp. 1-2.

Kim, J. et al, "A 120-MM2 64-MB NAND Flash Memory Achieving 180 NS/Byte Effective Program Speed", IEEE Journal of Solid-State Circuits, vol. 32, No. 5, May 1997, pp. 670-680.

Momodomi, M. et al, "A 4MB NAND EEPROM With Tight Programmed VT Distribution", IEEE Journal of Solid-State Circuits, vol. 26, Issue 4, Apr. 1991, pp. 492-496.

Kim, Jin-Ki, "Multilevel Flash Memory Cell With Balanced Cell VTH", Mar. 13, 2008, pp. 1-27.

Jung et al, "A 3.3V 128 MB Multi-Level NAND Flash Memory for Mass Storage Applications", Feb. 8, 1996, pp. 32-33 and 412.

Jung, T. et al, "A 117-MM2 3.3-V Only 128-MB Multilevel NAND Flash Memory for Mass Storage Applications", IEEE Journal of Solid-State Circuits, vol. 31, No. 11, Nov. 1996, pp. 1575-1583.

"2GBIT (256 X 8 Bits) CMOS NAND E2PROM", TH58NVG1S3AFT05, Toshiba MOS Digital Integrated Circuit Silicon Gate CMOS, May 19, 2003, pp. 1-32.

Lee, June et al, "A 90-NM CMOS 1.8-V 2-GB NAND Flash Memory for Mass Storage Applications", IEEE Journal of Solid-State Circuits, vol. 38, No. 11, Nov. 2003, pp. 1934-1942.

Aritome, S. et al, "A Reliable Bi-Polarity Write/Erase Technology in Flash EEPROMS", Int'l. Electron Devices Meeting, Technical Digest, Dec. 9, 1990, pp. 111-114.

Takeuchi, K. et al, "A 56NM CMOS 99MM2 8GB Multi-Level NAND Flash Memory With 10MB/S Program Throughput,Solid-State Circuits", 2006 IEEE International Conference Digest of Technical Papers, Session 7, ISBN:1-4244-0079-1, Feb. 6, 2006, 10 pages.

Tran, Michael Thanh, "U.S. Appl. No. 12/463,759, Notice of Allowance", Dated Aug. 11, 2010 , Aug. 11, 2010, pp. 1-4.

Byeon, D. et al, "An 8GB Multi-Level NAND Flash Memory With 63NM STI CMOS Process Technology", IEEE International Solid-State Circuits Conference, Feb. 7, 2005, pp. 46-47.

(56) References Cited

OTHER PUBLICATIONS

Lee, S. et al, "A 3.3V 4GB Four-Level NAND Flash Memory With 90NM CMOS Technology", ISSCC 2004/Session 2Non-Volatile Memory/2.7, IEEE International Solid-State Circuits Conference, Digest of Technical Papers, vol. 1, XP010722148, ISBN: 0-7803-8267-6, Feb. 16, 2004, 10 pages.

Kirisawa, R. et al, "A NAND Structured Cell With a New Programming Technology for Highly Reliable 5V-Only Flash EEPROM", 1990 Symposium on VLSI Technology, CH 2874-6, 90/0000-0129 1990 IEEE, Honolulu, US, Jun. 4, 1990, pp. 129-130.

Cho et al, "A 3.3 V 1 GB Multi-Level NAND Flash Memory With Non-Uniformthreshold Voltage Distribution", Feb. 5, 2001, pp. 28-29.

Gal, E. et al, "Algorithms and Data Structures for Flash Memories", ACM Computing Surveys (CSUR), vol. 37, No. 2; Jun. 2005, pp. 138-163.

Hara, T. et al, "A 146MM2 8GB NAND Flash Memory With 70NM CMOS Technology, ISSCC Session 2 Non-Volatile Memory 2.1", IEEE International Solid-State Circuits Conference, Feb. 7, 2005, pp. 44-45 and 584.

Kim, et al., "A 159mm2 32nm 32Gb MLC NAND-Flash Memory with 200MB/s Asynchronous DDR Interface", ISSCC 2010/Session 24/DRAM and Flash Memories/24.6, Samsung Electronics, 2010 IEEE International Solid-State Circuits Conference, Digest of Technical Papers, Feb. 10, 2010.

G.G. Marotta et al, "A 3bit/Cell 32Gb NAND Flash Memory at 34nm with6MB/s Program Throughput and with Dynamic 2b/Cell Blocks Configuration Mode for a Program Throughput Increase up to 13MB/s; Digest of Technical Papers", 2010 IEEE International Solid-State Circuits Conference, Feb. 10, 2010, pp. 444-446.

Samsung Electronics Co. Ltd., "2G x 8BIT NAND Flash Memory, K9XXG08UXM; K9GAG08U0M", Sep. 21, 2006, pp. 1-48.

IEEE Standard for High-Bandwidth Memory Interface Based on Scalable Coherent Interface (SCI) Signaling Technology (Ramlink), IEEE STD. 1596.4-1996, The Institute of Electrical Electronics Engineers, Inc., Mar. 19, 1996, 98 pages.

\* cited by examiner

| Word Line | 1 bit/cell (1 page/row) | 2 bit/cell (2 pages/row) | 3 bit/cell (3 pages/row) |
|---|---|---|---|
| WL32 | Page 32 [xxxxxxx0] | Page 64 (UP) [xxxxxxx1]<br>Page 63 (LP) [xxxxxxx0] | Page 96 (UP) [xxxxxx10]<br>Page 95 (IP) [xxxxxx01]<br>Page 94 (LP) [xxxxxx00] |
| ... | ... | ... | ... |
| WL2 | Page 2 [xxxxxxx0] | Page 4 (UP) [xxxxxxx1]<br>Page 3 (LP) [xxxxxxx0] | Page 6 (UP) [xxxxxx10]<br>Page 5 (IP) [xxxxxx01]<br>Page 4 (LP) [xxxxxx00] |
| WL1 | Page 1 [xxxxxxx0] | Page 2 (UP) [xxxxxxx1]<br>Page 1 (LP) [xxxxxxx0] | Page 3 (UP) [xxxxxx10]<br>Page 2 (IP) [xxxxxx01]<br>Page 1 (LP) [xxxxxx00] |

FIG. 11

FLASH MEMORY SYSTEM

CROSS REFERENCE TO RELATED APPLICATIONS

This application claims the benefit of priority of U.S. Provisional Patent Application No. 61/538,540 filed on Sep. 23, 2011, the contents of which are incorporated herein by reference in their entirety.

FIELD

The present embodiments relates generally to non-volatile memory.

BACKGROUND

Flash memory is a commonly used type of non-volatile memory in widespread use as mass storage for consumer electronics, such as, for example, digital cameras and portable digital music players. The density of a presently available flash memory chip can be up to several Gigabytes (GB) in size, which is suitable for use in popular USB flash drives since the size of one flash chip is small. Another emerging application for flash memory are solid state drives for replacing traditional hard disk drives used in laptop and desktop computers. These applications typically use multi-level cell (MLC) flash devices having limited lifespans. Other type flash memory of single level cell (SLC) flash devices is also used in applications for reliable data storing. Drawback of SLC flash devices is cost in comparison to MLC flash devices.

SUMMARY

In a first aspect, there is provided a method for programming a multiple bit per cell (MBC) flash memory device configured to store up to N pages of data per physical row, N being an integer greater than one. The method comprises issuing a group of program commands for programming multiple pages of data to a subdivision having at least one physical row of the flash memory device. The group of program commands is limited to addressing a subset of logical page addresses selected from all possible logical page addresses corresponding to each of the at least one physical row. The method further comprises programming less than N pages to each of the at least one physical row of the flash memory device in response to the subset of logical page addresses in the program commands. According to a present embodiment, the method further includes accessing a mapping table containing storage mode information for each subdivision of the flash memory device prior to issuing the group of program commands, where accessing the mapping table includes selecting the subdivision having a partial MBC storage mode where less than N pages of data are stored per physical row.

The present method can further include selecting the subset of logical page addresses corresponding to the partial MBC storage mode, and all the possible logical page addresses corresponding to each of the at least one physical row includes sequential page addresses starting with a lower page address and ending with an upper page address. The subset of logical page addresses can include the lower page address up to an intermediate page address between the lower page address and the upper page address for each of the at least one physical. Alternately, the subset of logical page addresses can include only lower page address for each of the at least one physical row.

In another embodiment of the first aspect, issuing includes iteratively providing program command packets each containing one page of the multiple pages of data and one of the subset of logical page addresses, and providing M program command packets for programming M pages of the multiple pages of data to one physical row of the flash memory device, where M is an integer value less than N. Alternately, issuing includes iteratively providing one program command packet for programming one page of the multiple pages of data to one physical row of the flash memory device.

In a further embodiment of the first aspect, the method further includes receiving a host request to program the multiple pages of data in a partial MBC storage mode prior to issuing the group of program commands. In yet another embodiment, the method further includes receiving a host request to program the multiple pages of data in a full MBC storage mode prior to issuing the group of program commands, determining that a maximum number of MBC program/erase cycles for the subdivision has been reached, and selecting another subdivision configured for programming the multiple pages of data in the full MBC storage mode, and setting the subdivision to a partial MBC storage mode. In this present embodiment, the full MBC storage mode includes a two-bit per cell storage mode, and the partial MBC storage mode includes a one-bit per cell storage mode.

In a second aspect, there is provided a system including a memory controller. The memory controller is configured to issue program commands limited to addressing a subset of logical page addresses selected from all possible logical page addresses corresponding to each physical row of a memory device. The memory device includes a multiple bit per cell (MBC) memory device configured to store a maximum of N pages per physical row, where N is an integer greater than one. The memory device is further configured to program less than N pages per physical row in response to the subset of logical page addresses in the program commands received from the memory controller. In the present embodiment, memory controller includes a mapping table for storing meta-data corresponding to subdivisions of the memory device, where the mapping table is configured to include storage mode information for each of the subdivisions and address binding information associated with the storage mode for each of the subdivisions.

In the present embodiment, the memory controller includes control circuitry for accessing the mapping table and providing the program commands in response to the meta-data of the mapping table. Each of the program commands includes a page of data, address information for selecting a subdivision of the memory device and a physical row within the subdivision, and a logical page address for the page of data to be programmed in the physical row. In this embodiment, the memory device is configured to store a maximum of N=2 pages per physical row, and each of the two pages per physical row are addressable by an upper page address and a lower page address, where the upper page address has a first least significant bit, and the lower page address has a second least significant bit different from the first least significant bit. According to further embodiments of the present aspect, the subdivisions of the memory device includes a memory block, a sub-block of a memory block, or a physical row of a memory block.

In a third aspect, there is provided a method for programming a multiple bit per cell (MBC) flash memory device configured for storing up to N bits per cell, where N is an integer greater than one. The method includes receiving a host request to program data pages; determining the data pages are to be programmed in a partial MBC storage mode where less than N virtually addressable data pages are stored in each physical row of the flash memory device; accessing a mapping table containing meta-data for the flash memory device to select a subdivision of the MBC flash memory device configured in the partial MBC storage mode; and issuing at least one program command for programming the data pages to the subdivision using virtual page addresses limited to a subset of less than N possible virtual page addresses for programming pages to each physical row. In the present aspect, N=2 and possible virtual page addresses include a lower page address and an upper page address, and issuing includes iteratively issuing program commands, each including a data page and a lower page address. Alternately, N>2 and possible virtual page addresses include a lower page address, an upper page address, and at least one intermediate page address between the lower page address and the upper page address, and issuing includes iteratively issuing program commands each including a data page and one of the lower page address and the at least one intermediate page address.

Other aspects and features of the described embodiments will become apparent to those ordinarily skilled in the art upon review of the following description of specific embodiments of the invention in conjunction with the accompanying figures.

BRIEF DESCRIPTION OF THE DRAWINGS

Embodiments will now be described by way of example only, with reference to the attached Figures, wherein:

FIG. 11 is a table illustrating an example mapping of virtual page addresses to physical rows;

DETAILED DESCRIPTION

Figure 1:
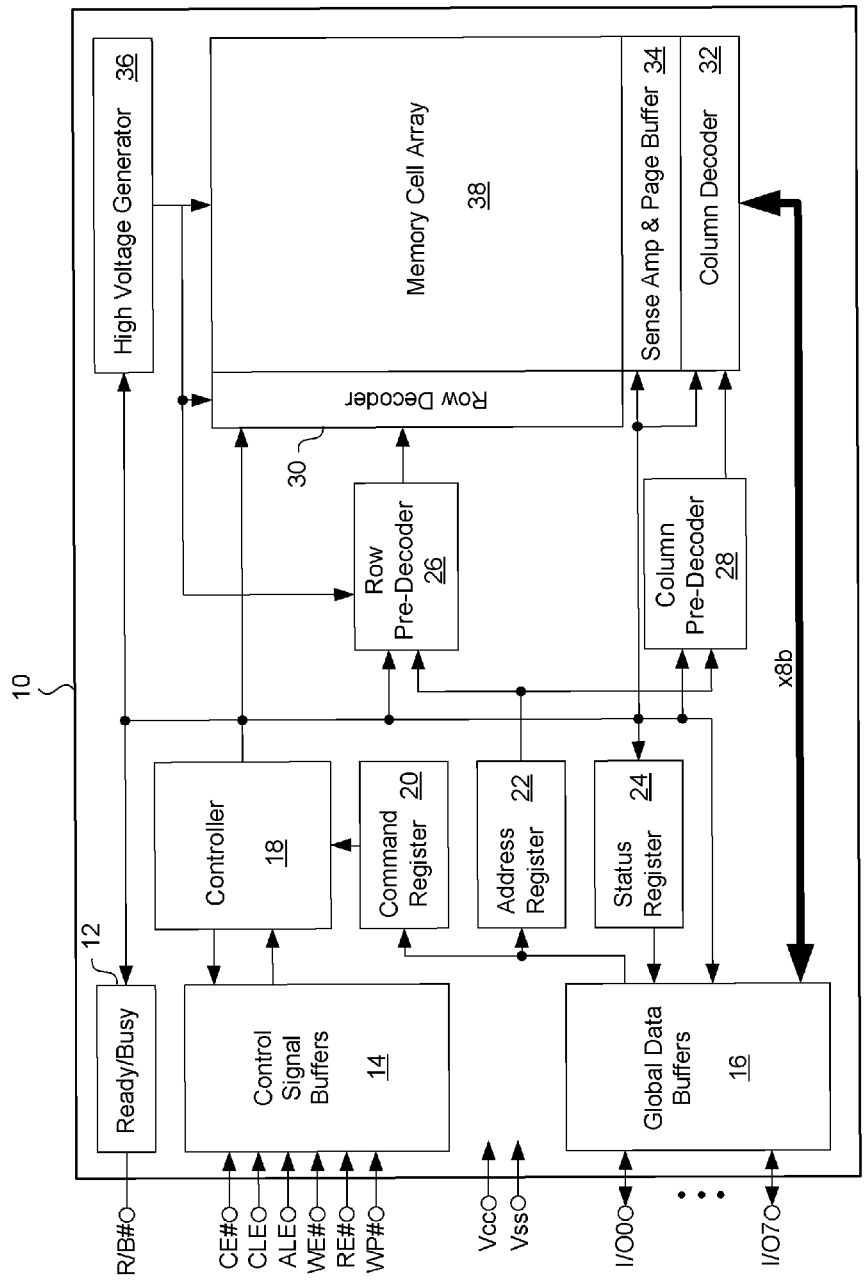
FIG. 1 is a block diagram of a flash memory device to which the present invention is applicable.

FIG. 1 depicts a typical flash memory device to which the embodiments of the present invention is applicable. Referring to FIG. 1, a flash memory device 10 includes input/output interface circuits, control circuits, memory circuits and a memory array. The input/output interface circuits of flash memory device 10 include a Ready/Busy signal buffer 12, control signal buffers 14 and global data buffers 16. In the particular example, the Ready/Busy signal buffer 12 is an output buffer which drives the Ready/Busy signal R/B# via a respective pin or port. The control signal buffers 14 are input buffers which receive flash memory control signals CE#, CLE, ALE, WE#, RE# and WP# from corresponding pins or ports. Signal names ending with "#" should be understood from this point forward as being active low level signals, where an active low signal corresponds to a "0" logic level, or a VSS voltage level for example. In contrast, an active high logic level signal corresponds to a "1" logic level, or a VDD or VCC voltage level for example. Following is a short description of the previously mentioned control signals.

Command Latch Enable (CLE): the CLE input signal is used to control loading of the operation mode command into the internal command register. The command is latched into the command register from the I/O port on the rising edge of the WE# signal while CLE is High.

Address Latch Enable (ALE): the ALE signal is used to control loading address information into the internal address register. Address information is latched into the address register from the I/O port on the rising edge of the WE# signal while ALE is High.

Chip Enable (CE#): the device goes into a low-power Standby mode when CE# goes High during the device is in Ready state. The CE# signal is ignored when device is in Busy state (R/B#=L), such as during a Program or Erase or Read operation, and will not enter Standby mode even if the CE# input goes High.

Write Enable (WE#): the WE# signal is used to control the acquisition of data from the I/O port.

Read Enable (RE#): the RE signal controls serial data output. Data is available after the falling edge of RE#. The internal column address counter is also incremented (Address=Address+I) on this falling edge.

I/O Port (I/O0 to 7): I/O0 to 7 pins are used as a port for transferring address, command and input/output data to and from the device.

Write Protect (WP#): the WP# signal is used to protect the device from accidental programming or erasing. The internal voltage regulator (high voltage generator) is reset when WP# is Low. This signal is usually used for protecting the data during the power-on/off sequence when input signals are invalid.

Ready/Busy (R/B#): the R/B# is open drain pin and the output signal is used to indicate the operating condition of the device. The R/B# signal is in Busy state (R/B#=L) during the Program, Erase and Read operations and will return to Ready state (R/B#=H) after completion of the operation.

The global data buffers 16 are bi-directional buffers which receive write data and provide read data on respective input/output (I/O) pins or ports. The flash memory device 10 is shown to have eight such ports I/O0 to I/O7, but can have more or less than eight in alternate data width configurations. These I/O ports are also used for receive address and command information.

The control circuits of flash memory device 10 include controller 18, command register 20, address register 22 and status register 24. Controller 18 controls various functions of the other circuits in flash memory device 10, where such functions include read, program and program verification, for example. While not shown, the controller 18 can include a command decoder for executing the functions in response to a received command. The registers 22, 24 store types of information received by flash memory device 10 or to be provided to an external host system (not shown), including a memory controller (not shown) for example. The described registers are not intended to be exhaustive, and other registers can be included, such as data registers for example.

The circuits primary controlled by controller 18 are the memory circuits, which include row and column pre-decoders 26 and 28, row and column decoders 30 and 32, sense amplifiers and page buffer block 34, and a high voltage generator 36. Memory cell array 38 of flash memory device 10 includes NAND cell strings connected to bitlines, where each memory cell of a NAND cell string is connected to a wordline. Further details of the NAND cell string is shown later in FIG. 3. The row pre-decoder 26, row decoder 30 and high voltage generator 36 are controlled in a programming operation to drive a selected wordline to a high voltage effective for shifting a threshold voltage of the connected memory cell from a default erased threshold voltage to a desired voltage level. It is noted that a high voltage may be used in the memory array 38 to erase memory cells by shifting their threshold voltages to the default value. Different combinations of high voltages and applied time of the high voltages can be used to set specific threshold voltages for a flash memory cell. A combination for programming a specific threshold voltage can be referred to as a programming profile. The page buffer 34 stores a page of data to be programmed to the cells connected to the selected wordline. Generally, a memory cell connected to a bitline is either inhibited from being programmed or enabled for programming via the selected wordline, depending on the logic level the bitline is biased, or set to. The data bits stored in the page buffer are used to bias the bitline. The memory cell array 38 has any number of banks, which is a selected design parameter for a particular flash device.

Figure 2:
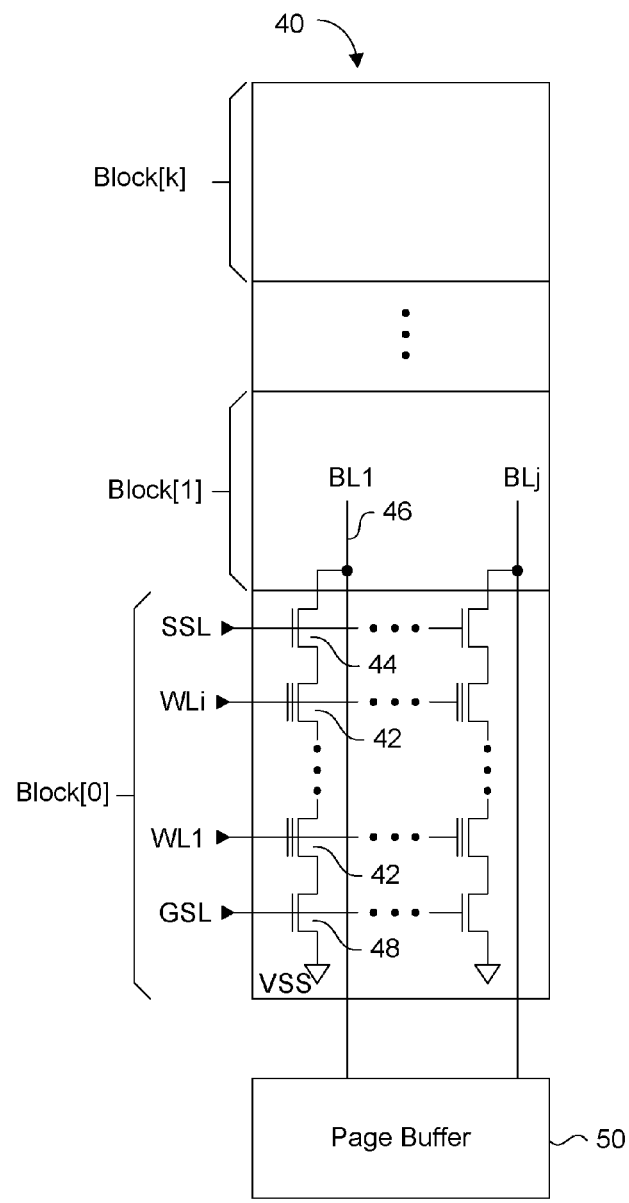
FIG. 2 is a schematic showing the organization of one memory bank of the flash memory device of FIG. 1.

FIG. 2 shows the organization of one bank 40 of the memory cell array 38 of FIG. 1. Bank 40 is organized into k blocks, and each block has i pages. Both k and i are integer values. Each page corresponds to a row of memory cells coupled to a common wordline. A detailed description of the memory cells of the block follows.

Each block includes NAND memory cell strings, having up to i flash memory cells 42 serially arranged and electrically coupled to each other. Accordingly, wordlines WL1 to WLi are coupled to the gates of each flash memory cell in the memory cell string. A string select device 44 coupled to signal SSL (string select line) selectively connects the memory cell string to a bitline 46, while a ground select device 48 coupled to signal GSL (ground select line) selectively connects the memory cell string to a source line, such as VSS. The string select device 44 and the ground select device 48 are N-channel transistors.

There are j bitlines 46 common to all blocks of bank 40, and each bitline 46 is coupled to one NAND memory cell string in each of blocks [1] to [k]. Variable j is an integer value. Each wordline (WL1 to WLi), SSL and GSL signal is coupled to the same corresponding transistor device in each NAND memory cell string in the block. As those skilled in the art should understand, data stored in the flash memory cells along one wordline is referred to as a page of data.

Coupled to each bitline outside of the bank 40 is a page buffer 50 for storing one page of write data to be programmed into one page of flash memory cells. Page buffer 50 corresponds to the sense amplifiers and page buffer block 34 shown in FIG. 1. Accordingly, page buffer 50 also includes sense circuits for sensing data read from one page of flash memory cells. During programming operations, the page buffer performs program verify operations to ensure that the data has been properly programmed into the flash memory cells coupled to the selected wordline. Programming within a block typically starts at the page corresponding to WL1, and proceeds sequentially up to WLi to fill the present block. Alternately, programming can start at WLi and proceed sequentially down to WL1. Then programming continues with WL1 of a new block.

Flash memory 10 can be configured to store data in one of two different ways. Data can be stored in a single bit per cell (SBC) storage mode or a multiple bit per cell (MBC) storage mode In the SBC storage mode, exactly one bit of information is stored in one cell to represent one of two possible states. In the MBC storage mode, at least two bits are stored in one cell to represent one of four possible states.

Figure 3:
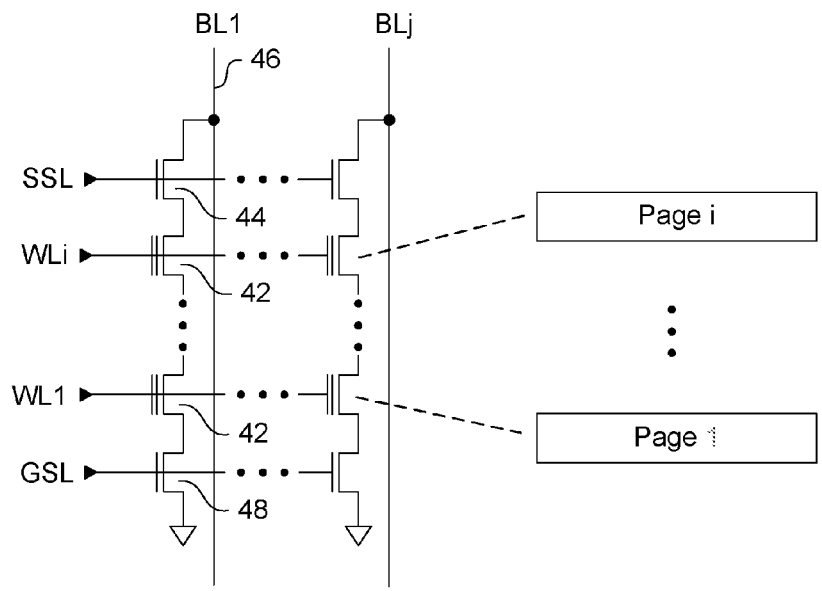
FIG. 3 is a circuit schematic showing single bit per cell (SBC) mapping of pages of data to rows of flash memory cells.

FIG. 3 shows the same two NAND cell strings of FIG. 2, with additional annotations to help illustrate were pages of data is are stored in an SLC configured flash memory device. Each of the memory cells connected to the same physical word line i.e. such as WL1, store one bit of data of a page of data. Therefore as shown in FIG. 3, the cells connected to physical word line WL1 store "Page 1" while the cells connected to the last physical word line WLi store "Page i".

Figure 4:
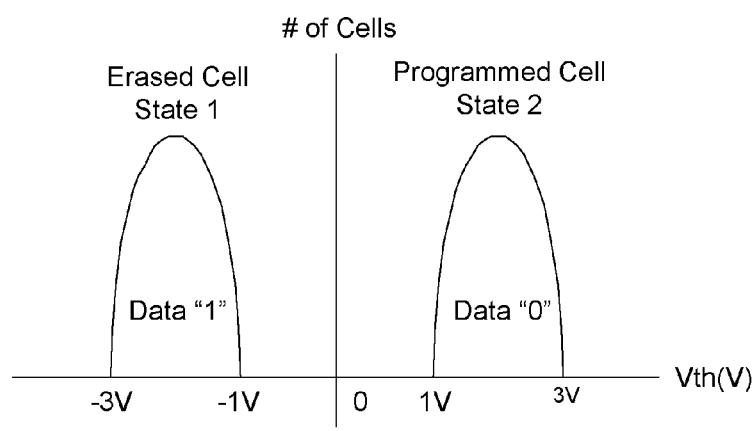
FIG. 4 is a graph of threshold voltage distribution for SBC data storage.

FIG. 4 shows a threshold voltage (Vt) distribution for erased memory cells and programmed memory cells in the SBC storage mode. Due to process and voltage supply variations, the erased and programmed threshold voltages are distributed within a voltage range. As shown in FIG. 3, erased memory cells have a negative threshold voltage between −3V to −1V, while programmed memory cells have a positive threshold voltage between 1V and 3V. The ranges depend on the desired threshold voltage for the memory cells. The threshold voltage ranges are illustrative of possible threshold voltages that can be used in a particular flash memory device, however those skilled in the art would understand that the selection of threshold voltages to use for erased and programmed memory cells depend on the design and manufacturing process of the flash memory device. Those skilled in the art would understand that different flash devices have different threshold voltage ranges to suit a particular design or application.

Figure 5:
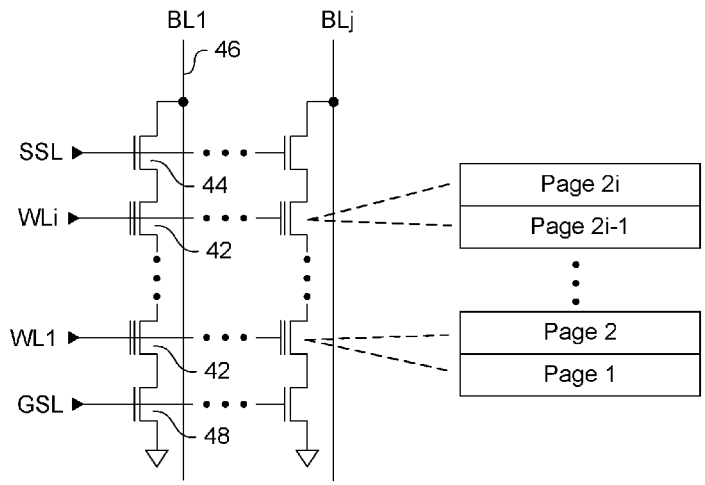
FIG. 5 is a circuit schematic showing multiple bit per cell (MBC) mapping of two pages of data to rows of flash memory cells.

FIG. 5 shows a circuit identical to that of FIG. 3, except that two bits of data are stored in each memory cell for a two-bit per cell MLC configured flash memory device.

Therefore, each physical word line stores two pages of data. As shown in FIG. 5, the physical row addressed by WL1 stores logical Page 1 and Page 2. The last wordline WLi stores Page 2i and Page 2i–1, where "i" is an integer value.

Figure 6:
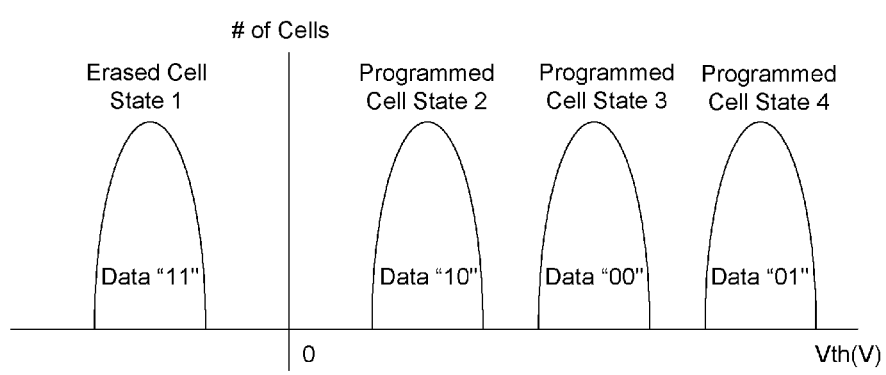
FIG. 6 is a graph of threshold voltage distribution for two-bit MBC data storage.

FIG. 6 shows the threshold voltage distribution graph of the possible states that can be stored in each memory cell and the corresponding two-bit combination each state represents.

Figure 7:
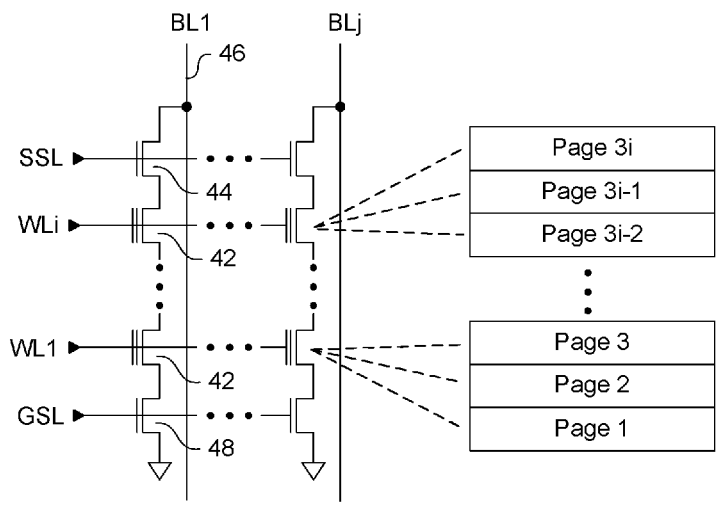
FIG. 7 is a circuit schematic showing MBC mapping of three pages of data to rows of flash memory cells.

FIG. 7 shows a circuit identical to that of FIG. 3, except that three bits of data are stored in each memory cell for a three-bit per cell MLC configured flash memory device. Therefore, each physical word line stores three pages of data. As shown in FIG. 7, the physical row addressed by WL1 stores logical Page 1, Page 2 and Page 3. The last wordline WLi stores Page 3i, Page 3i–1 and Page 3i–2, where "i" is an integer value. It is noted that Page 3i, Page 3i–1 and Page 3i–2 are general mathematical expressions for representing the page numbers of the upper page, the intermediate page and the lower page for each wordline, respectively.

Figure 8:
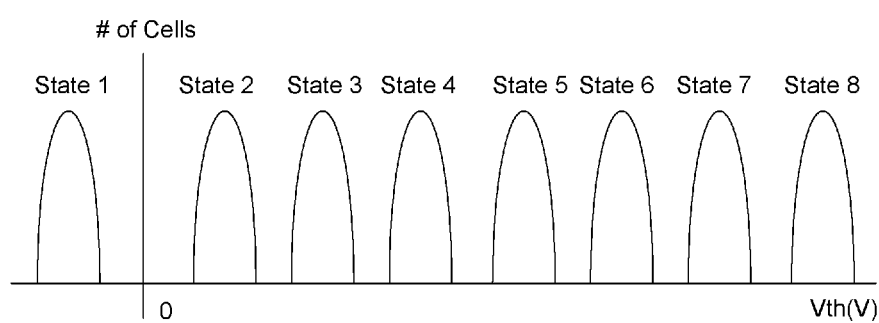
FIG. 8 is a graph of threshold voltage distribution for three-bit MBC data storage.

FIG. 8 shows the threshold voltage distribution graph of the possible states that can be stored in each memory cell, each of which represents a possible 3-bit combination.

The advantage of storing data in the MBC storage mode (two bits per cell or more) is the at least doubling of storage capacity over the SBC storage mode when using the same number of cells. Typically, flash memory manufacturers apply a mask option during the fabrication process to configure the flash memory device 10 to execute either SBC specific algorithms or MBC specific algorithms, since the flash circuits are controlled differently between SBC and MBC read and program operations.

It is well known that flash memory devices have a limited number of erase-program cycles before they can no longer be used to store data reliably. For example, the typical rated erase-program cycles for current SBC flash memory is about 100,000 cycles. However, current MBC flash memory has a smaller rated limit of 10,000 cycles due to the fact that the cells are subjected to higher stresses. The above mentioned erase-program cycle limits are examples only, but it is well understood that MBC flash memory devices have significantly lower erase-program cycles than SBC configured flash memory devices.

While MBC flash memory is suitable for most consumer applications, the 10,000 cycle program-erase limit may be insufficient for other applications where data programming and erasing is frequent, or the data is mission-critical. Hence this problem is more critical for commercial applications, such as HDD applications, where there are more frequent program-erase cycles. Because HDD applications require higher data integrity than most consumer applications, MBC flash memory is not suited for use due to its relatively short 10,000 cycle life span. Specialized dual-mode SBC/MBC flash memory devices have been proposed where the operating mode is either statically set or dynamically changed on-the-fly. Different command sets and/or logic circuits are required for such dual-mode devices.

In the end, the cost of SBC flash memory devices currently exceeds the cost of higher density MBC flash memory devices as vendors recognize that customers requiring high reliability will pay for the higher cost devices. The specialized dual-mode SBC/MBC flash memory devices may also cost more than MBC flash memory devices.

It is, therefore, desirable to provide a low cost flash memory system where an MBC flash memory device can be used for storing data in the SBC storage mode.

Generally, at least some example embodiments provide a method and system for controlling an MBC configured flash memory device to store data in an SBC storage mode, or a partial MBC storage mode less than a full MBC storage mode capacity. In a full MBC storage mode, pages of data are programmed sequentially from a first page to an Nth page for each physical row of memory cells, where N is the total number of pages that can be stored a physical row. Up to N virtual page addresses per physical row of memory cells accompany each page to be programmed for designating the virtual position of the page in the physical row. For SBC or partial MBC data storage, a flash memory controller issues program command(s) to the MBC memory device using less than the maximum N virtual page addresses for each physical row. The MBC memory device sequentially executes programming operations up to the last received virtual page address for the physical row.

Figure 9:
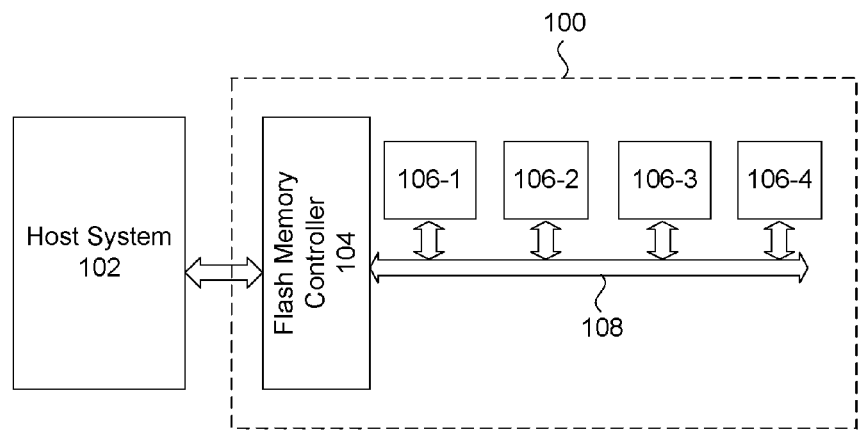
FIG. 9 is a block diagram of a flash memory system according to one embodiment of the present invention.
Figure 10:
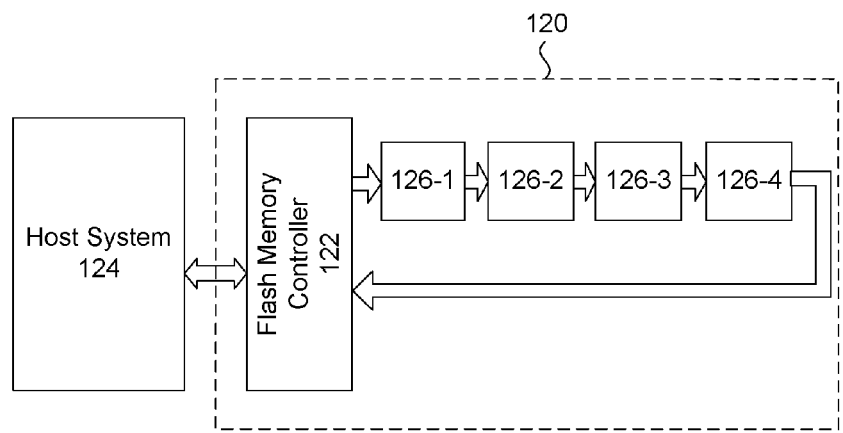
FIG. 10 is a block diagram of a flash memory system according to another embodiment of the present invention.

The presently described embodiments can be used in the memory systems shown in FIG. 9 and FIG. 10.

FIG. 9 shows a flash memory system according to an embodiment of the present invention. Referring to FIG. 9, a flash memory system 100 is integrated with a host system 102. Flash memory system 100 includes a flash memory controller 104 in communication with host system 102, and a plurality of MBC flash memory devices 106-1-106-4. The host system 102 includes a processing device such as a microcontroller, microprocessor, or a computer system (not shown). The flash memory system 100 is configured to include one channel 108, where MBC flash memory devices 106-1-106-4 are coupled in parallel to channel 108. Channel 108 includes a set of common buses (not shown), which include data and control lines that are coupled to all the memory devices 106-1-106-4. While not shown, each memory device is enabled/disabled with a respective chip select signal provided by flash memory controller 104. The flash memory controller 104 is responsible for issuing commands and data, via the channel 108, to a selected one of the memory devices 106-1-106-4 based on the operation of the host system 102. Data read from the selected one of the memory devices 106-1-106-4 is transferred via the channel 108 back to the flash memory controller 104 which in turn provides the read data to the host system 102. Those skilled in the art would understand that the memory system 100 can have more or less memory devices coupled to the channel 108.

Flash memory system 100 is generally referred to as a multi-drop configuration, in which the MBC flash memory devices 106-1-106-4 are coupled in parallel with respect to channel 108. The flash memory controller 104 can have multiple channels, each with flash memory devices 106-1-106-4 coupled in the multi-drop configuration. Each of the MBC flash memory device 106-1-106-4 can be NAND flash memory devices having the bank memory organization previously shown in FIG. 2. The flash memory devices 106-1-106-4 can have the same capacity or different capacities.

FIG. 10 shows a flash memory system according to another embodiment of the present invention. Referring to FIG. 10, flash memory system 120 includes a flash memory controller 122 in communication with host system 124, and a plurality of flash memories that are connected in series. In the particular example, four MBC flash memory devices 126-1-126-4 are serially coupled. Each of the four flash memory devices 126-1-126-4 has an input/output circuit for facilitating operation between memory devices. Those skilled in the art would understand that the memory system 120 can have more or less memory devices that are serially coupled with the flash memory controller 122. An example of such a flash memory device is described in commonly owned U.S. patent application Ser. No. 11/354,023, filed on Dec. 30, 2005, and commonly owned U.S. patent application Ser. No. 11/496,278, filed on Jul. 31, 2006, the contents of which are incorporated herein by reference.

According to the present embodiments, the MBC memory devices of the systems of FIG. 9 and FIG. 10 have internal controllers configured to recognize received page addresses and determine which specific programming algorithm is required. For example, a page address corresponding to a first page to be programmed to a physical row is programmed with a different algorithm than a second page to be programmed to a physical row. The memory controllers 104 and 122 are configured with an address binding scheme for limiting the usable virtual address space for programming pages of data to a physical row of memory cells. This address binding scheme is used to program data in an SBC mode or a partial MBC mode. In a partial MBC storage mode, more than one page of data is stored in a physical row of memory cells, but less than the maximum number of pages which can be stored in the physical row of memory cells. For example, if an MBC memory device can store more three bits/cell (or more than three pages of data per physical row), then the memory controller can be configured to have a first address binding scheme for programming data in an SBC storage mode, and a second address binding scheme for programming data in a two-bit/cell MBC storage mode.

In the embodiments, an address binding scheme can be applied to any sub-division of the memory array, where a sub-division can include a memory block, a sub-block or portion of a memory block, or a physical row. Therefore, combinations of different address binding schemes with different and sub-divisions can be realized for improved system flexibility.

FIG. 11 is a table illustrating an example mapping of virtual page addresses to a physical row or word line of a NAND flash memory array for an SBC storage mode where one bit of data is stored per cell, an MBC storage mode where two bits of data are stored per cell, and an MBC storage mode where three bits of data are stored per cell.

In the presently shown example, it is assumed that the NAND cell string includes 32 word lines (WL1-WL32), each referred to as a physical row. The second column from the left side of the table shows the virtual address mapping for a one bit per cell data storage mode. Accordingly, in the one bit per cell storage mode, one page of data (Page 1-Page 32) is stored in each physical row. Appearing in square brackets beside each numbered page is an 8 bit virtual pages address, where the least significant bit (LSB) is at the rightmost bit position. In the present example, the first seven bits of each virtual page address are shown with an "x" while the LSB is shown as either a "0" or "1". It is assumed in this example that the pages are programmed in the sequential order from WL1 to WL32, therefore the virtual addresses are also sequentially ordered.

In the column labeled "2 bit/cell", 2 pages of data are stored in each physical row. Because of the sequential programming, the first page to be programmed is referred to as a lower page (LP) while the second and last page to be programmed is referred to as an upper page (UP).

Figure 12A:
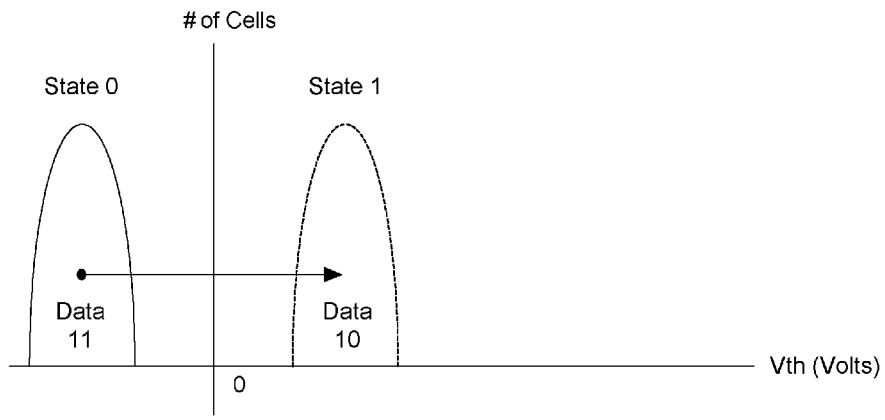
FIGS. 12A and 12B are graph of threshold voltage distribution for a two-bit MBC programming sequence.
Figure 12B:
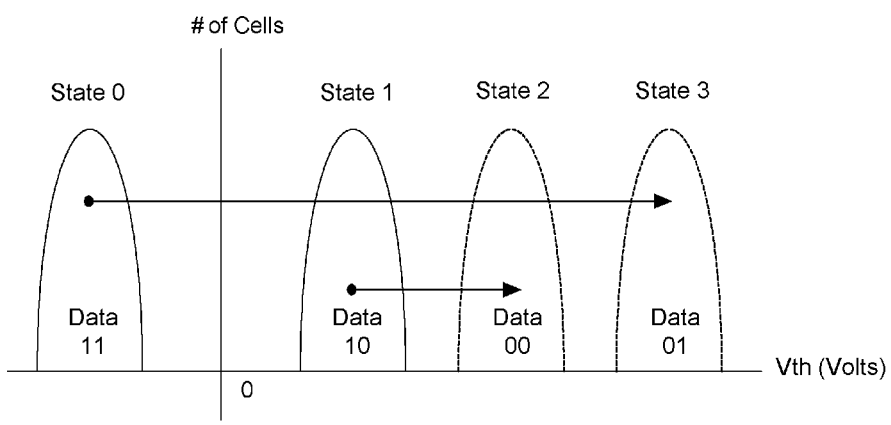

FIG. 12A shows an example threshold voltage distribution of the possible threshold voltages of a two bit MBC memory after the lower page has been programmed. FIG. 12B shows an example threshold voltage distribution of the possible threshold voltages after the upper page has been programmed, taking into account the previously programmed lower page data of FIG. 12A. The arrow in FIG. 12A shows that an erased State 0 cell can have its threshold shifted to State 1 after lower page programming. The arrows in FIG. 12B shows where the threshold voltages corresponding to State 0 and State 1 can be shifted after upper page programming.

It should be noted that the LSB for the lower page of each physical row is a "0", while the LSB for the upper page of each physical row is a "1". In alternate embodiments, the LSB for the lower and upper pages can differ from what is shown in the table of FIG. 11. However, the lower pages for each physical row will have the same LSB, and the upper pages for each physical row will have the same LSB.

Referring to FIG. 11, in the column labeled "3 bit/cell", 3 pages of data are stored in each physical row. In this 3 bit per cell MBC storage mode, a lower page is first programmed, followed by an intermediate page (IP), and lastly an upper page.

Figure 13A:
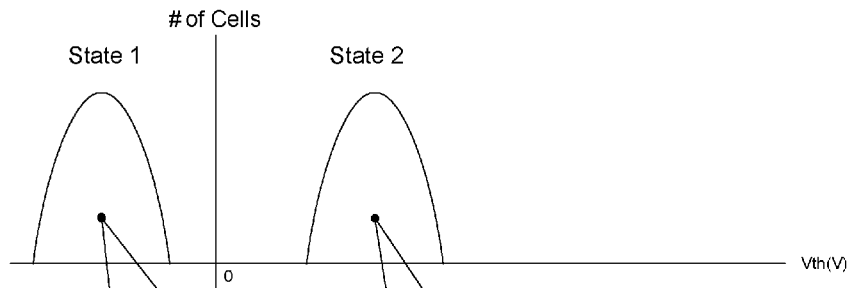
FIGS. 13A, 13B and 13C are graphs of threshold voltage distribution for a three-bit MBC programming sequence.
Figure 13B:
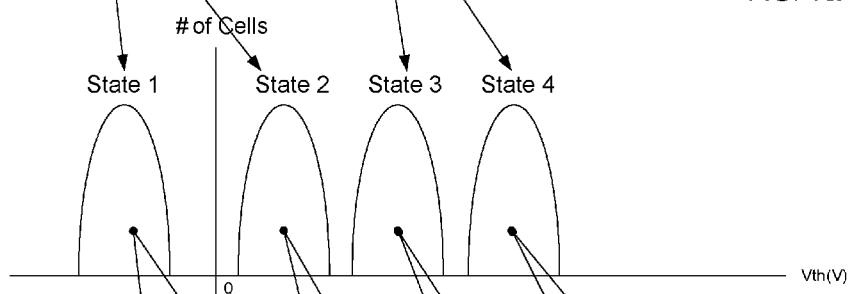
Figure 13C:
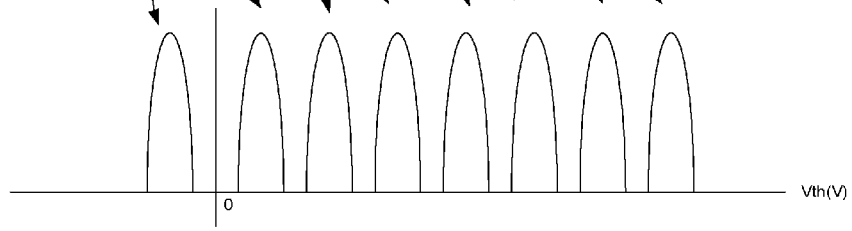

FIG. 13A shows an example threshold voltage distribution of the possible threshold voltages of a three bit MBC memory after the lower page has been programmed. FIG. 13B shows an example threshold voltage distribution of the possible threshold voltages after the intermediate page has been programmed, taking into account the previously programmed lower page data of FIG. 13A. FIG. 13C shows an example threshold voltage distribution of the possible threshold voltages after the upper page has been programmed, taking into account the previously programmed lower page data of FIG. 13B.

In the MBC storage modes where more than three bits are stored per cell, there can be at least two intermediate pages between the lower page and the upper page. It should be noted that the last two LSB for the lower page of each physical row is a "00", the last two LSB for the intermediate page of each physical row is a "01", and the last two LSB for the upper page of each physical row is a "10". In alternate embodiments, the last two LSB for the lower, intermediate and upper pages can differ from what is shown in the table of FIG. 11. However, the lower pages for each physical row will have the same last two LSB, the intermediate pages for each physical row will have the same last two LSB, and the upper pages for each physical row will have the same last two LSB.

According to the embodiments, an MBC memory device for storing up to N pages per physical row and having a virtual page address scheme as shown in FIG. 11 can be controlled to program data into a subdivision of the memory array in a storage mode of less than N pages per physical row. This is done with a memory controller configured to issue program commands using only a subset of the available virtual page addresses that otherwise would be used for addressing the full N pages per physical row. More specifically, the subset of virtual page addresses is limited to the lowest sequential set of available virtual page addresses per physical row. The number of virtual page addresses of the subset determines the storage mode for the MBC memory device. This is referred to as an address binding scheme for limiting the virtual page addresses to only those which are used for a specific storage mode.

With reference to the table of FIG. 11 by example, a three-bit MBC memory device can store up to N=3 pages of data addressable with N=3 virtual page addresses per physical row. In order to store data in an SBC storage mode to a memory block by example, the memory controller issues program commands for each page of data, where the provided corresponding virtual page addresses are for the lower page of each physical row. As shown in FIG. 13A, the resulting possible threshold voltage corresponds to either State 1 or State 2 after each lower page is programmed to a corresponding physical row. In a partial MBC storage mode where two pages are stored in each physical row, the issued program commands for each physical row include the lower page and the intermediate page addresses. Each physical row will have one of the four possible states shown in FIG. 13B after the intermediate page of data is programmed.

Figure 14:
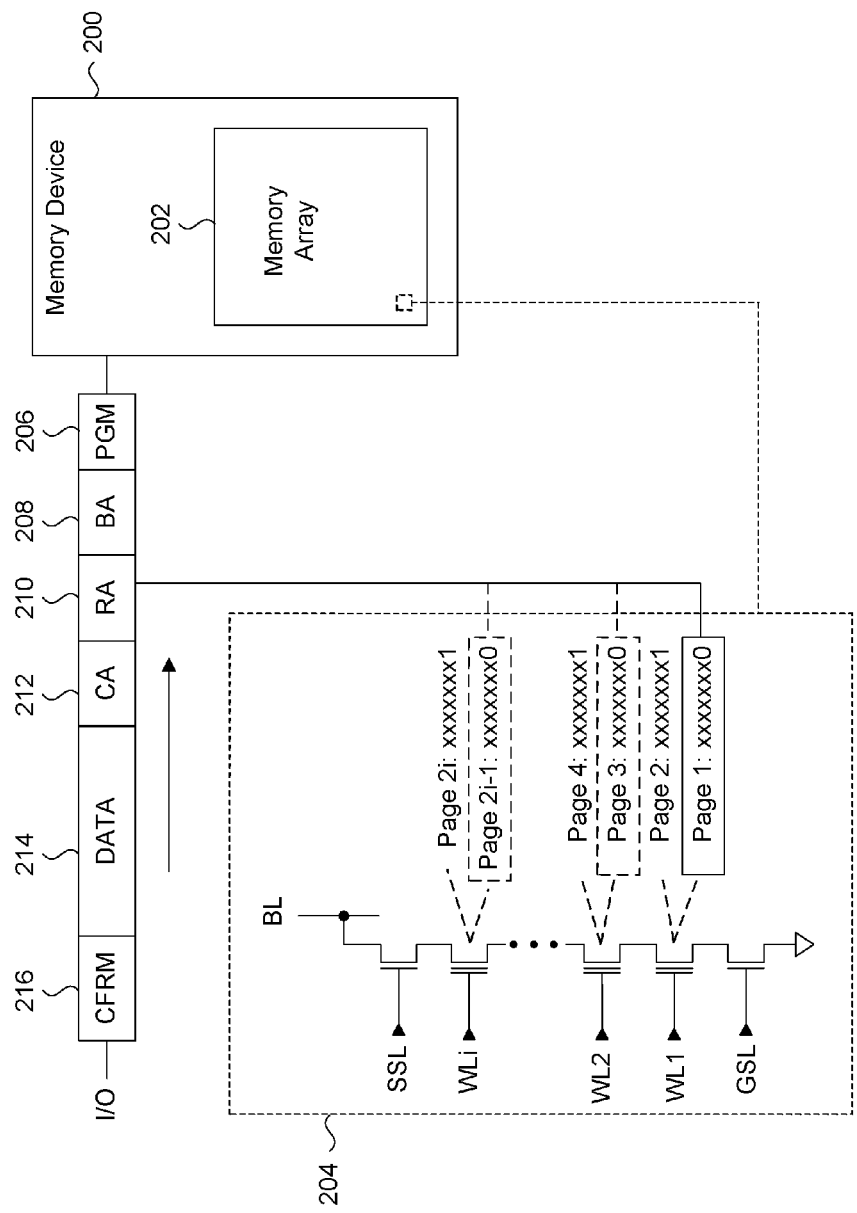
FIG. 14 is a diagram illustrating an example of an SBC program operation for a two-bit MBC memory device, according to an embodiment of the present invention.

FIG. 14 shows an example of an SBC program operation for a two-bit MBC memory device, according to an embodiment of the present invention. Referring to FIG. 14, a two-bit MBC memory device 200 is controlled to store data into a memory block in the SBC storage mode. The memory device 200 includes a memory array 202 having NAND cell strings which form a memory block 204, and can have the flash memory device block diagram shown in FIG. 1. In the example shown in FIG. 14, only one NAND cell string of memory block 204 is shown. Also, the virtual page addressing scheme shown in the table of FIG. 11 is used for the two-bit MBC memory device 200. A program command packet issued to the memory device 200 includes an initial program operation (OP) code field (PGM) 206, a block address field (BA) 208, a row address field (RA) 210, a column address field (CA) 212, a data field (DATA) 214 and a confirm program OP code field (CFRM) 216. In the present example, OP code field 206 includes a predetermined binary sequence that instructs the memory device 200 that information relating to a program operation is to follow. The block address field 208 contains a block address used to select a specific memory block within the memory array 202. The row address field 210 contains the virtual page address for a selected physical row, where a higher order bit that is not the LSB is used to address the physical word line. The column address field 212 contains a starting column address for storage of the data. The data field 214 contains the page of data to be programmed. The confirm program OP code field 216 includes a predetermined binary sequence that indicates to the memory device 200 that the program operation can proceed.

The presently shown program command packet can be provided as a serial bitstream, or in parallel via input ports. The program command packets may differ for different memory systems, and thus may omit OP code fields 206 and/or 216, or may include additional protocol information. The order and format of the program command packet can be changed. The program command packet needs the address information for programming of the page of data.

In the present SBC storage mode example, the row address field 210 is limited to including virtual page addresses corresponding to only the lower pages for each physical row. In FIG. 14, these virtual page addresses are boxed to illustrate that the virtual page addresses are bound to those corresponding to the lower pages for memory block 204. Therefore, to program pages of data in the SBC storage mode to all physical rows of memory block 204, successive program command packets are provided to memory device 200, where each program command packet includes a page of data to be programmed and a lower page virtual page address. Although the memory device 200 is configured for programming up to two pages of data per physical row, thereby resulting in one of four possible states as shown in FIG. 12B, programming only a lower page results in the two possible threshold voltage distributions shown in FIG. 12A. Therefore, SBC storage mode programming is achieved in a two-bit MBC memory device.

Accordingly, a subdivision of the memory array 202 that no longer reliably stores data in the full MBC storage mode because it has reached its number of predetermined program/erase cycles, can be downgraded to store data in the SBC storage mode. Conversion of a subdivision from full MBC storage to SBC storage is referred to as a "downgrade" if the primary purpose of the subdivision is to maximize data storage capacity. Alternately, such a conversion can be referred to as an "upgrade" if the primary purpose of the subdivision is to store data reliably.

The same address binding principle can be applied to a three-bit MBC memory device where a subdivision is used to store data in the SBC storage mode. However, a three-bit or more MBC memory device has the added advantage in that the subdivision can be progressively changed from the full MBC storage mode to the next lower partial MBC storage mode as the number of program/erase cycles for the specific storage mode is reached.

Figure 15:
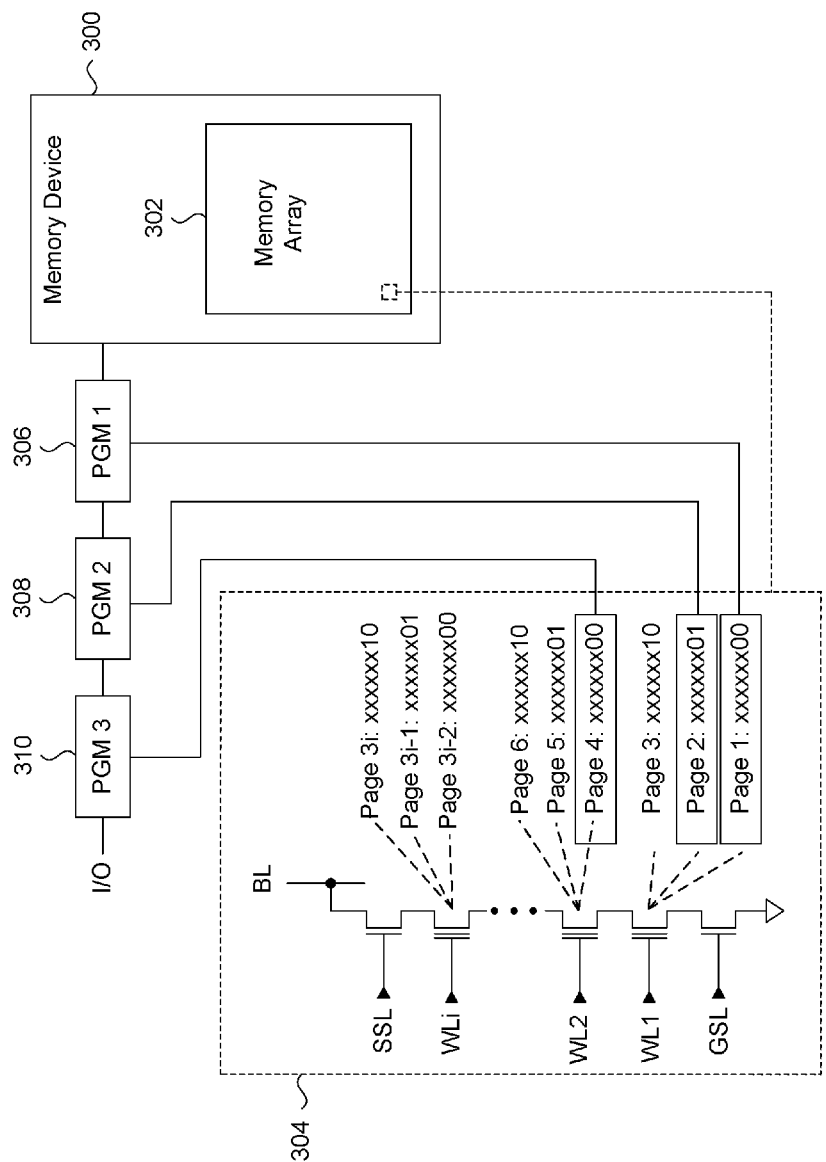
FIG. 15 is a diagram illustrating an example two-bit MBC program operation for a three-bit MBC memory device, according to an embodiment of the present invention.

FIG. 15 shows an example two-bit MBC program operation for a three-bit MBC memory device, according to an embodiment of the present invention. Referring to FIG. 15, a three-bit MBC memory device 300 is controlled to store data into a memory block in a two-bit MBC storage mode. Memory device 300 includes a memory array 302 having NAND cell strings which form a memory block 304. Only one NAND cell string of memory block 304 is shown. The virtual pages addressing scheme shown in the table of FIG. 11 is used for the three-bit MBC memory device. In this example, three successive program command packets 306, 308 and 310 are provided to memory device 300. Each of program command packets 306, 308 and 310 can have the same format as the program command packet previously shown in FIG. 14. Program command packet 306 contains data for Page 1 and a corresponding lower page virtual address. Program command packet 308 contains data for Page 2 and a corresponding intermediate page virtual address. Program command packet 310 contains data for Page 4 and a corresponding lower page virtual address. In the case of a three-bit MBC memory device the controller, such as Controller 18 of the memory device 10 of FIG. 1, will look at the last two the significant bits of the virtual page address in order to determine which programming algorithm to use. This is due to the fact that there are three page addresses per physical row, and using only the LSB is insufficient for determining which programming algorithm to use.

Therefore, when memory device 300 receives program command packet 306, a programming operation is executed to program Page 1 to the memory cells connected to WL1. The resulting possible threshold voltage distribution for these memory cells is shown in either FIG. 12A or FIG. 13A. After memory device 300 receives program command packet 308, a programming operation is executed program page 1 to the memory cells connected to WL1. Because a second page of data is being programmed to the memory cells connected to WL1, a programming algorithm different from the one used for programming Page 1 is used. The resulting possible threshold voltage distribution for these memory cells is shown in either FIG. 12B or FIG. 13B. The two bit MBC programming for the memory cells connected to WL1 is now complete. The third program command packet 310 is received by memory device 300 for programming in new lower page, Page 4, to the next word line WL2. Once programmed, the memory cells connected to WL1 will have the possible threshold voltage distribution shown in either FIG. 12A or FIG. 13A. While not shown, additional program command packets are received by memory device 300 for programming data to the remaining physical rows of memory block 304. The advantage of using a three bit or more MBC memory device is that a subdivision can be used in a two bit MBC storage mode and then later on in an SBC storage mode.

Figure 16:
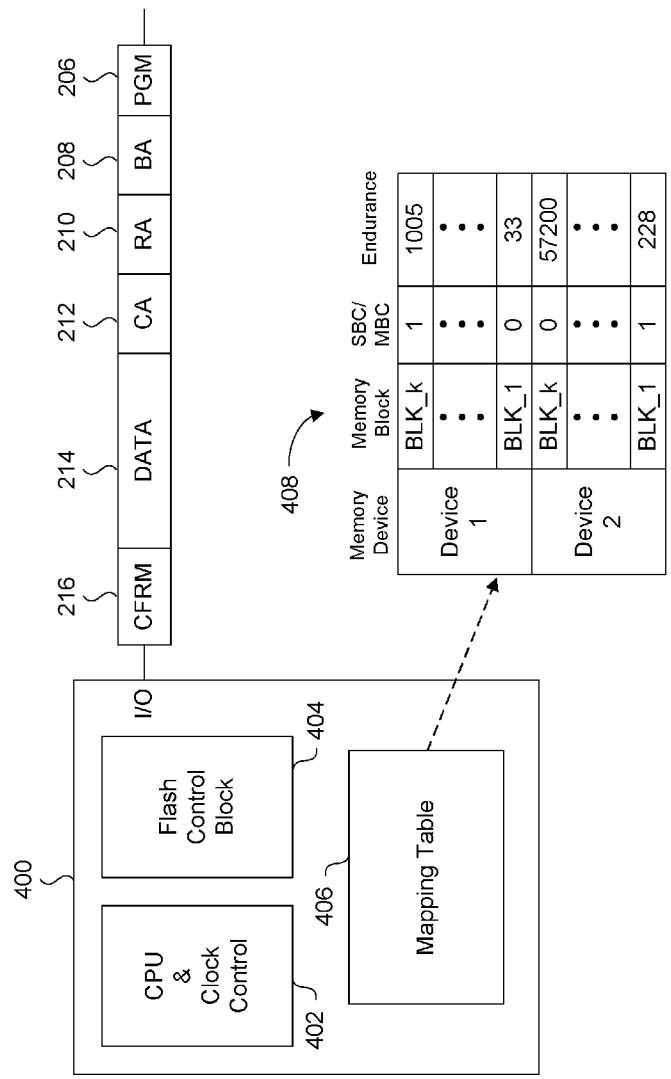
FIG. 16 is a diagram illustrating an example of N-bit MBC flash memory controller with an example mapping table stored in a memory controller, according to an embodiment of the present invention.

FIG. 16 shows an example of N-bit MBC flash memory controller. Referring to FIG. 16, an N-bit MBC flash memory controller 400 is configured with at least one address binding scheme for programming data in a less than N bit storage mode. The memory controller 400 generally includes a CPU and clock control block 402, a flash control block 404, and a mapping table 406. While not shown, the CPU and clock control block 402 includes a central processing unit for communicating with other subsystems via a common bus, clock generators for providing the necessary clock signals to the other circuits of the memory controller 400, and other circuits which may be necessary to enable proper operation of the device. The flash control block 404 includes a file and memory management sub-block, an ECC (error correcting code) sub-block and a physical flash interface sub-block. The flash memory devices are accessed through the physical Flash interface sub-block. Accessed data from the Flash memory devices are checked and corrected by the ECC sub-block. The file and memory management sub-block provides logical to physical address translation, and executes wear-leveling algorithms.

Generally the Flash control block 404 precisely tracks and updates properties of the memory devices (information) such as erase cycle, valid/empty and so on for each page or block of each Flash memory device in the system is connected to. This information is stored in local memory and structured as a mapping table. An example mapping table 408 is shown in FIG. 16. Mapping table 408 stores information for each memory device, referred to as meta-data, which can include an SBC/MBC status bit designating the data storage mode for each block, and the number of program/erase cycles for each block. An SBC/MBC status bit of "0" can indicate that the subdivision stores data in the MBC storage mode, while a "1" can indicate that the subdivision stores data in the SBC storage mode. It should be understood that for MBC memory devices storing more than three bits per cell, at least two status bits are used for designating each of the possible data storage modes. It is noted that the flash memory controller also keeps track of the virtual page address range for each memory device, and for each address binding scheme the flash memory controller is programmed with an algorithm to use only the allowed virtual page addresses for the specific storage mode.

The flash control block 404 continuously updates and monitors mapping table 408 during the lifetime of the memory system. It is noted that the mapping table can be populated with information at power up of the memory system, and information such as the endurance and SBC/MBC status may be stored in the memory devices in extra data fields associated with each physical row and/or memory block. If a page or block reaches to the maximum number of program/erase cycles (10K cycle in the MLC Flash memory), the flash control block 404 can decide to change the storage mode to an SBC storage mode, thereby extending the program/erase cycles to 100K.

When the memory controller 400 receives a host request to program data, the flash control block 404 looks up the mapping table 406 to determine where the data should be programmed. If the selected memory block is configured for the SBC storage mode, then the preprogrammed address binding scheme for using only the lower page virtual addresses for each physical row is applied. Assuming that multiple pages are to be programmed, command packets are prepared and issued by the memory controller 400 to the selected MBC memory device, each having a row address field contains only lower page virtual addresses.

Figure 17:
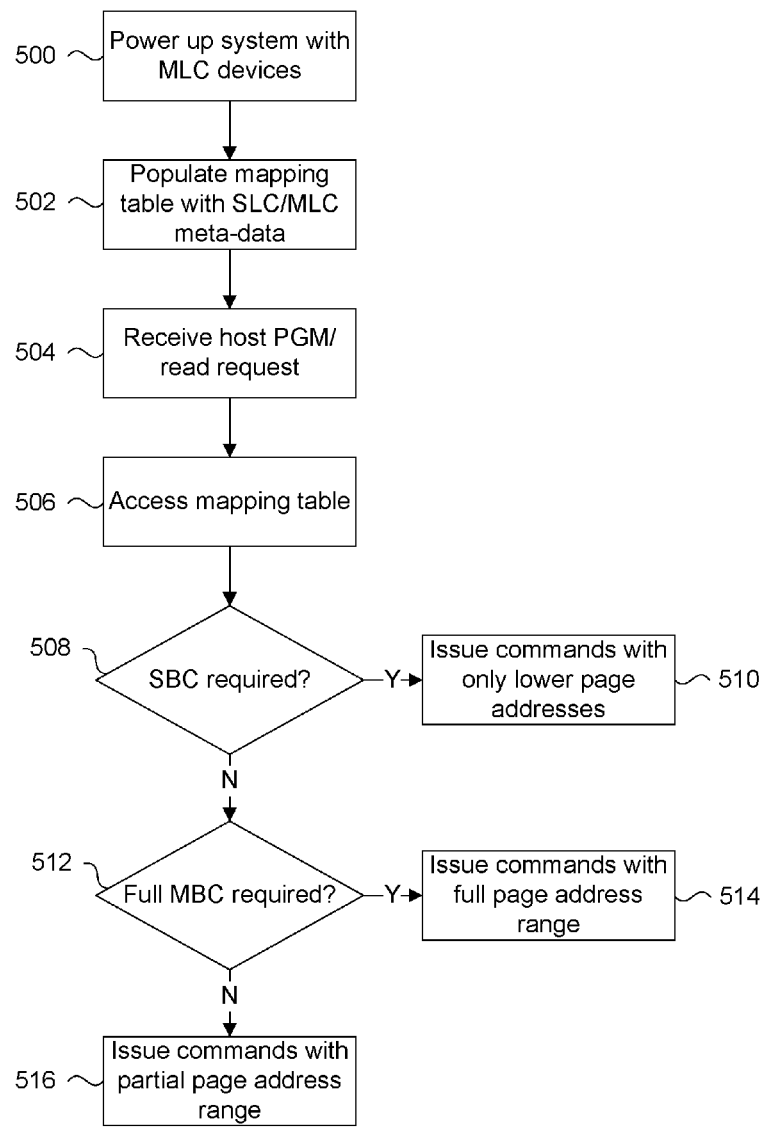
FIG. 17 is a flow chart of a method of operating a memory controller to issue programming commands to an MBC memory device, according to an embodiment of the present invention.

FIG. 17 is a flow chart of a method of operating a memory controller to issue commands in the SBC, full MBC or partial MBC storage modes, for the purpose of controlling an MBC memory device to store data, according to a present embodiment.

Referring to FIGS. 16 and 17, the method starts by powering up the memory system (step 500). The memory system includes a memory controller configured similar to memory controller 400, and at least one N bit MBC memory device. This memory system can have the configuration shown in FIG. 9 or FIG. 10. As part of the power up sequence, the memory controller executes a scan of the at least one N bit MBC memory device to obtain device meta-data, such as endurance and SBC/MBC status information for its subdivisions (step 502). This information is collected and stored in the mapping table of the memory controller 400. Once the power up sequence has completed, the memory controller 400 can receive commands from the host device. A host program request is received by the memory controller 400 (step 504). This request may include some priority level for the data to be programmed. For example, low priority data can be non-critical media data and high priority data can be data designated as requiring high reliability storage. Other algorithms of the memory controller 400 can be executed to determine the appropriate wear leveling technique to use, based on parameters such as size of the data to be programmed, availability of free space in the memory devices, and the previously described priority level, by example.

The memory controller accesses its mapping table to identify where the data should be stored, based on the aforementioned algorithms executed by the memory controller 400 (step 506). Subsequently, the memory controller determines if SLC storage is required for the host program request (step 508). If SLC storage is required, then the memory controller 400 issues commands at step 510 for storing the data in a selected subdivision using an SBC address binding scheme where only lower page virtual addresses for each physical row are used. Otherwise, the method proceeds to step 512 where the memory controller determines if full MLC programming is required. If full MLC programming is required, the memory controller issues commands with the full virtual page address range for each physical row (step 514). Otherwise, commands are issued with a partial MLC address binding scheme where a subset of the full range of virtual page addresses per physical row are used for programming data (step 516).

The commands issued by the memory controller according to the method of FIG. 17 do not require issuance of special commands for configuring operation of the selected MBC memory device in another storage mode. This ensures higher performance of the memory system as no clock cycles are wasted for configuring the MBC memory device, since the commands are issued on-the-fly. Furthermore, no resetting of the memory device is required for setting it to the required storage mode.

Figure 18:
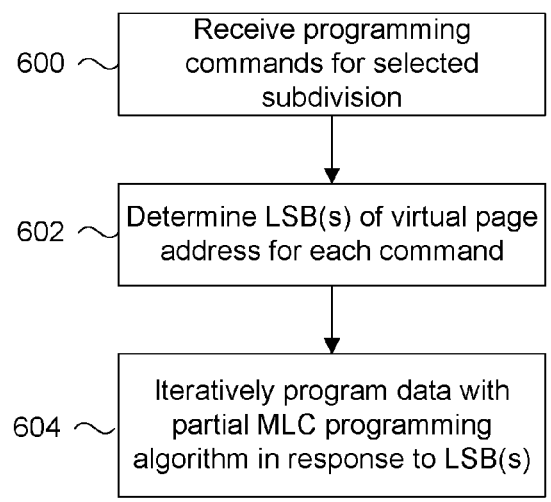
FIG. 18 is a flow chart of a method for operating an MBC memory device in response to programming commands received from a memory controller, according to an embodiment of the present invention.

FIG. 18 shows the operation of an N bit MBC memory device that receives commands from a memory controller operating with the method outlined in FIG. 17. Referring to FIG. 18, the method starts where programming commands issued by the memory controller 400 are received by the MBC memory device (step 600). Collectively, these commands are for programming a set of data requested by the host, which could span multiple pages. It should be noted that the memory device can receive interleaved commands for programming different sets of data to different subdivisions of the memory device. In other words, one command can be received to initiate programming of data to one subdivision, and a subsequently received command can be received to initiate programming of data to another subdivision. Then a third command can be received to continue programming more data to the first subdivision. Subsequently, the MBC memory device checks at least the LSB of the virtual page address associated with each page of data (step 602). If for example the MBC memory device is configured for up to three bit per cell data storage, then the last two LSBs are checked. If for example the MBC memory device is configured for up to two bit per cell data storage, then the last LSB is checked. Regardless of the maximum number of bits the memory device is configured to store per cell, there will be a minimum number of virtual page address LSBs required for identifying each virtual page of a physical row. These are the LSBs to be checked at step 602. The internal controller, also referred to as a command decoder, of the MBC memory device then executes the appropriate programming sequence or algorithm in response to the LSBs at step 604. More specifically, the internal controller executes partial MLC programming algorithms, which includes any programming algorithm for less than the maximum number of bits per cell for the MBC memory device. This internal controller is shown by example in the flash memory device block diagram of FIG. 1 as controller 18.

For example, the internal controller of the MBC memory device can execute an SBC programming algorithm if the LSB of the virtual page address is a "0". If no further program command with a virtual page address LSB of "1" is received, then the page has been programmed to the physical row in the SBC storage mode. The resulting possible threshold voltages for the cells of the physical row can appear as shown in FIG. 12A or 13A by example. In another example, a pair of program commands are received where the first includes a virtual page address LSB of "0" and the second includes a virtual page address LSB of "1". In this scenario, the first page of data is programmed with the SBC programming algorithm. The second page of data having an LSB of "1" for the same physical row is then programmed according to a 2-bit MBC programming algorithm, which is executed by the internal controller of the memory device. The resulting possible threshold voltages for the cells of the physical row can appear as shown in FIG. 12B or 13B.

Figure 19:
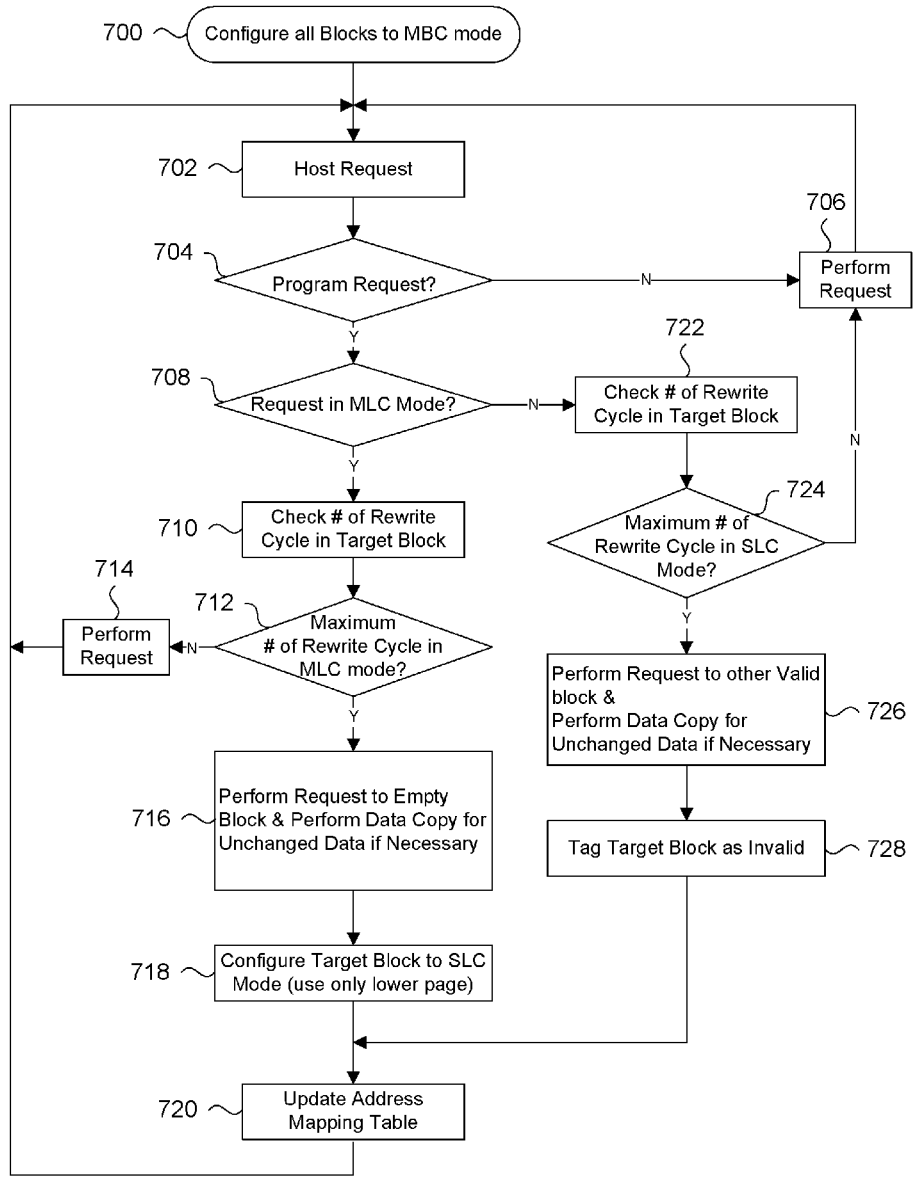
FIG. 19 is a flow chart illustrating a method of a detailed example operation of a memory system, according to an embodiment of the present invention.

FIG. 19 shows a detailed example operation of the memory system according to an embodiment. Starting at step 700 it is assumed that the MBC memory device has all its subdivisions, such as memory blocks by example, configured for full N bit MBC storage, where N is the maximum number of bits which can be stored per cell. In the present example, it is assumed that N=2. Therefore, the mapping table of the memory controller would have the SLC/MLC status bit(s) for each subdivision set to represent full MLC data storage mode. A host request is received by the memory controller at step 702, and the memory controller determines if the request is one of a program request or an erase request at step 704. If the host request is neither, then the request is executed at step 706 and the system waits for another host request. Otherwise, the method proceeds to step 708 where the memory controller further determines if the data should be programmed in the MBC mode. If data is to be programmed in the MBC storage mode, then the number of program/erase cycles for a selected memory block is checked at step 710. At step 712, a determination if the maximum number of program/erase cycles for the selected memory block has been reached is executed. If not, then the MLC program operation is executed by issuing the required program commands to the memory device at step 714.

On the other hand, if the maximum number of program/erase cycles for the selected memory block has been reached, the memory controller then executes a block life span extending algorithm. This algorithm begins at step 716 where the new data is programmed to either an available MLC or SLC configured memory block. Any resident data in the originally selected memory block is later copied during background operations to an available MLC or SLC configured memory block, which can be the same memory block to which the new data was recently programmed to. This background operation can be scheduled by the memory controller.

At step 718 the selected block is converted for use as an SLC memory block by updating its corresponding SLC/MLC tag bit in the memory array. The mapping table of the memory controller is updated at step 720 to reflect this change in the storage mode of the selected memory block. This updating can further include resetting the number of program/erase cycles for the converted SLC memory block to an appropriate SLC program/erase limit. For example, this limit can be between 10K to 100K cycles.

Returning to the decision at step 708, if the program request is for SLC storage, then the number of program/erase cycles for a selected SLC memory block is checked at step 722 to determine if the maximum number of cycles has been reached. If at step 724 the maximum number of cycles has not been reached for the selected SLC memory block, then the SLC program operation is executed at step 706 by issuing the required program commands to the memory device. As previously discussed, an SLC address binding scheme is used by the memory controller for issuing program commands with virtual page addresses limited to those of the lower pages for each physical row. Otherwise, the SLC memory block cannot reliably store SLC data and the method proceeds to step 726 where the SLC program operation is executed for another available SLC memory block, and any resident data in the originally selected SLC memory block is copied to the same available SLC memory block or another available SLC memory block. The originally selected SLC memory block is tagged as being invalid in the memory device at step 728, and the mapping table in the memory controller is correspondingly updated at step 720. Tagging the memory block as invalid has the effect of retiring the memory block from future use.

The advantage of the presently shown embodiments is that any storage mode of operation less than the full MBC storage mode of a memory device can be executed without setting any registers, restarting the memory device or any other interruption to its normal operation.

In all the previously discussed embodiments, the selective MBC or SBC processes executed by the flash memory controller are done transparently to the user. There are no additional instructions, or modification of instructions required from the user, as all determination of SBC/MBC storage mode operations are done by the flash memory controller. Accordingly, there is minimal overhead required for implementing the presently described flash memory system with a host system.

In the preceding description, for purposes of explanation, numerous details are set forth in order to provide a thorough understanding of the embodiments. However, it will be apparent to one skilled in the art that these specific details are not required in order to practice the embodiments. In other instances, well-known electrical structures and circuits are shown in block diagram form in order not to obscure the aspects of the embodiments. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A method for programming a multiple bit per cell (MBC) flash memory device configured to store up to N pages of data per physical row, N being an integer greater than one, the method comprising:
   issuing a group of program commands for programming multiple pages of data to a subdivision having at least one physical row of the flash memory device,
   the group of program commands being limited to addressing a subset of logical page addresses selected from all possible logical page addresses corresponding to each of the at least one physical row, where each program command comprises a row address having at least one bit representing a selected physical row and at least one bit representing a logical page address of the subset of logical page addresses corresponding to the selected physical row; and
   programming less than N pages to each of the at least one physical row of the flash memory device in response to the subset of logical page addresses indicated in the row addresses in the program commands.

2. The method of claim 1, further comprising:
   accessing a mapping table containing storage mode information for each subdivision of the flash memory device prior to issuing the group of program commands.

3. The method of claim 2, wherein the accessing the mapping table includes:
   selecting the subdivision having a partial MBC storage mode where less than N pages of data are stored per physical row.

4. The method of claim 3, further comprising:
   selecting the subset of logical page addresses corresponding to the partial MBC storage mode.

5. The method of claim 4, wherein all the possible logical page addresses corresponding to each of the at least one physical row includes sequential page addresses starting with a lower page address and ending with an upper page address.

6. The method of claim 5, wherein the subset of logical page addresses includes the lower page address up to an intermediate page address between the lower page address and the upper page address for each of the at least one physical row.

7. The method of claim 5, wherein the subset of logical page addresses include only lower page address for each of the at least one physical row.

8. The method of claim 5, wherein issuing includes iteratively providing program command packets each containing one page of the multiple pages of data and one of the subset of logical page addresses.

9. The method of claim 8, wherein the issuing includes:
   providing M program command packets for programming M pages of the multiple pages of data to one physical row of the flash memory device, where M is an integer value less than N.

10. The method of claim 8, wherein the issuing includes:
    iteratively providing one program command packet for programming one page of the multiple pages of data to one physical row of the flash memory device.

11. The method of claim 1, further comprising:
    receiving a host request to program the multiple pages of data in a partial MBC storage mode prior to issuing the group of program commands.

12. The method of claim 1, further comprising:
    receiving a host request to program the multiple pages of data in a full MBC storage mode prior to issuing the group of program commands.

13. The method of claim 12, including determining that a maximum number of MBC program/erase cycles for the subdivision has been reached.

14. The method of claim 13, further comprising:
    selecting another subdivision configured for programming the multiple pages of data in the full MBC storage mode, and setting the subdivision to a partial MBC storage mode.

15. The method of claim 14, wherein the full MBC storage mode includes a two-bit per cell storage mode, and the partial MBC storage mode includes a one-bit per cell storage mode.

16. A system comprising:
    a memory controller configured to issue program commands limited to addressing a subset of logical page addresses selected from all possible logical page addresses corresponding to each physical row of a memory device, where each program command comprises a row address having at least one bit representing a selected physical row and at least one bit representing a logical page address of the subset of logical page addresses corresponding to the selected physical row, the memory device comprising:
    a multiple bit per cell (MBC) memory device configured to
       store a maximum of N pages per physical row, N being an integer greater than one, and
       program less than N pages per physical row in response to the subset of logical page addresses indicated in the row addresses in the program commands received from the memory controller.

17. The system of claim 16, wherein the memory controller includes:
    a mapping table for storing meta-data corresponding to subdivisions of the memory device.

18. The system of claim 17, wherein the mapping table is configured to include storage mode information for each of the subdivisions.

19. The system of claim 18, wherein the mapping table is configured to include address binding information associated with the storage mode for each of the subdivisions.

20. The system of claim 19, wherein the memory controller includes: control circuitry for accessing the mapping table and providing the program commands in response to the meta-data of the mapping table.

21. The system of claim 20, wherein each of the program commands includes:
    a page of data, address information for selecting a subdivision of the memory device and a physical row within the subdivision, and
    a logical page address for the page of data to be programmed in the physical row.

22. The system of claim 21, wherein:
    the memory device is configured to store a maximum of N=2 pages per physical row, and each of the two pages per physical row are addressable by an upper page address and a lower page address.

23. The system of claim 22, wherein:
the upper page address has a first least significant bit, and the lower page address has a second least significant bit different from the first least significant bit.

24. The system of claim 17, wherein the subdivisions of the memory device includes a memory block.

25. The system of claim 17, wherein the subdivisions of the memory device includes a sub-block of a memory block.

26. The system of claim 17, wherein the subdivisions of the memory device includes a physical row of a memory block.

27. A method for programming a multiple bit per cell (MBC) flash memory device configured for storing up to N bits per cell, where N is an integer greater than one, the method comprising:
receiving a host request to program data pages;
determining the data pages are to be programmed in a partial MBC storage mode where less than N virtually addressable data pages are stored in each physical row of the flash memory device;
accessing a mapping table containing meta-data for the flash memory device to select a subdivision of the MBC flash memory device configured in the partial MBC storage mode; and
issuing at least one program command for programming the data pages to the subdivision using virtual page addresses limited to a subset of less than N possible virtual page addresses for programming pages to each physical row, where each program command comprises a row address having at least one bit representing a selected physical row and at least one bit representing a virtual page address of the subset of less than N possible virtual page addresses corresponding to the selected physical row.

28. The method of claim 27, wherein:
N=2 and possible virtual page addresses include a lower page address and an upper page address, and
issuing includes iteratively issuing program commands, each including a data page and a lower page address.

29. The method of claim 27, wherein:
N>2 and possible virtual page addresses include a lower page address, an upper page address, and at least one intermediate page address between the lower page address and the upper page address, and
issuing includes iteratively issuing program commands each including a data page and one of the lower page address and the at least one intermediate page address.

* * * * *